(12) United States Patent
Helsley et al.

(10) Patent No.: US 7,103,750 B2
(45) Date of Patent: Sep. 5, 2006

(54) METHOD AND APPARATUS FOR FINDING REPEATED SUBSTRINGS IN PATTERN RECOGNITION

(75) Inventors: Matthew L. Helsley, Beaverton, OR (US); Kerry A. Kravec, Bethel Park, PA (US); Ali G. Saidi, Austin, TX (US); Jan M. Slyfield, San Jose, CA (US); Pascal R. Tannhof, Fontainebleau (FR)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 10/393,139

(22) Filed: Mar. 20, 2003

(65) Prior Publication Data

US 2004/0186977 A1 Sep. 23, 2004

(51) Int. Cl.
*G06F 12/00* (2006.01)

(52) U.S. Cl. .................. 711/217; 711/218; 711/219; 711/2; 382/209; 382/233; 382/235; 382/232; 382/283

(58) Field of Classification Search .............. 711/2, 711/218, 219, 104; 712/245; 714/743; 707/7; 382/209, 233
See application file for complete search history.

(56) References Cited

U.S. PATENT DOCUMENTS

| | | | |
|---|---|---|---|
| 4,297,528 A * | 10/1981 | Beno ........................... 704/244 |
| 4,639,919 A * | 1/1987 | Chang et al. ................ 714/743 |
| 4,673,816 A | 6/1987 | Matsui et al. ................ 250/556 |
| 4,760,523 A * | 7/1988 | Yu et al. ........................ 707/7 |
| 4,843,562 A * | 6/1989 | Kenyon et al. ................ 702/73 |
| 5,434,568 A | 7/1995 | Moll .............................. 341/87 |
| 5,528,526 A | 6/1996 | Klug et al. ............. 364/715.11 |
| 5,668,897 A * | 9/1997 | Stolfo ......................... 382/283 |
| 5,696,844 A * | 12/1997 | Takagi ........................ 382/199 |
| 5,748,780 A * | 5/1998 | Stolfo ......................... 382/232 |
| 5,784,607 A * | 7/1998 | Henry et al. ................. 712/245 |
| 6,092,065 A | 7/2000 | Floratos et al. ................. 707/6 |
| 6,285,686 B1 | 9/2001 | Sharma ....................... 370/477 |
| 6,363,176 B1 * | 3/2002 | Numata ....................... 382/233 |
| 6,397,186 B1 * | 5/2002 | Bush et al. .................. 704/274 |
| 6,658,148 B1 * | 12/2003 | Fung et al. .................. 382/209 |
| 2004/0128137 A1* | 7/2004 | Bush et al. .................. 704/275 |

* cited by examiner

*Primary Examiner*—Mano Padmanabhan
*Assistant Examiner*—Mardochee Chery
(74) *Attorney, Agent, or Firm*—Richard F. Frankeny; Winstead Sechrest & Minick PC

(57) ABSTRACT

A method and apparatus for compressing a reference pattern (RP) with repeated substrings by encoding produce compressed reference patterns (CRPs) with reduce storage requirements. Operation codes and a flag are stored with the CRPs. During comparison of reference elements of the CRP to input elements (IEs) of an input pattern (IP), the operation codes are read and the reference pattern is decoded allowing all reference elements including those of the repeated substrings to be compared to IEs in the IP to determine if the RP appears within the IP.

21 Claims, 6 Drawing Sheets

METHOD AND APPARATUS FOR FINDING REPEATED SUBSTRINGS IN PATTERN RECOGNITION

CROSS REFERENCE TO RELATED APPLICATIONS

This application is related to the following commonly owned U.S. patent applications:

Ser. No. 10/393,296 filed Mar. 20, 2003 entitled, "Method and Apparatus For Imbedded Pattern Recognition Using Dual Alternating Pointers", and Ser. No. 10/393,146 filed Mar. 20, 2003 entitled, "Method and Apparatus For Performing Fast Closest Match In Pattern Recognition", which are hereby incorporated by reference herein.

TECHNICAL FIELD

The present invention relates in general to pattern recognition systems and in particular to methods and systems for reducing the storage required for reference patterns (RPs) containing repeating substrings (RSs).

BACKGROUND INFORMATION

Recognizing patterns within a set of data is important in many fields, including speech recognition, image processing, seismic data, etc. Some image processors collect image data and then pre-process the data to prepare it to be correlated to reference data. Other systems, like speech recognition, are real time where the input data is compared in real time to reference data to recognize patterns. Once the patterns are "recognized" or matched to a reference, the system may output the reference. For example, a speech recognition system may output equivalent text to the processed speech patterns. Other systems, like biological systems may use similar techniques to determine sequences in molecular strings like DNA.

In some systems, there is a need to find patterns that are imbedded in a continuous data stream. In non-aligned data streams there are some situations where patterns may be missed if only a single byte-by-byte comparison is implemented. The situation where patterns may be missed occurs when there is a repeated or nested repeating patterns in the input stream or the pattern to be detected. A RP containing the sequence that is being searched for is loaded into storage where each element of the sequence has a unique address. An address register is loaded with the address of the first element of the RP that is to be compared with the first element of the input pattern (IP). This address register is called a "pointer." In the general case, a pointer may be loaded with an address that may be either incremented (increased) or decremented (decreased). The value of the element pointed to by the pointer is retrieved and compared with input elements (IEs) that are clocked or loaded into a comparator.

In pattern recognition, it is often desired to compare elements of an IP to many RPs. For example, it may be desired to compare an IP resulting from digitizing a finger print to a library of RPs (all finger prints on file). To do the job quickly, elements of each RP may be compared in parallel with elements in the IP. Each RP may have repeating substrings (short patterns) which are smaller patterns embedded within the RP. Since a library of RPs may be quite large, the processing required may be considerable. It would be desirable to have a way of reducing the amount of storage necessary to hold the RPs. If the amount of data used to represent the RPs could be reduced, it may also reduce the time necessary to load and unload the RPs. Parallel processing may also be used where each one of the RPs and the IP are loaded into separate processing units to determine matches.

Other pattern recognition processing in biological systems may require the comparison of an IP to a large number of stored RPs that have substrings that are repeated. Processing in small parallel processing units may be limited by the storage size required for the RPs. Portable, inexpensive processing systems for chemical analysis, biological analysis, etc. may also be limited by the amount of storage needed to quickly process large numbers of RPs with repeating substrings.

There is, therefore, a need for a method and an apparatus to reduce the amount of information necessary to store RPs with repeated substrings by compressing and encoding the data representing the RPs. There is also a need for a method and apparatus to read and decode the RPs so that elements of the RPs may be compared to elements in an IP to determine occurrences of the RP contained in the IP.

SUMMARY OF THE INVENTION

RPs with repeating substrings are encoded and compressed so that they take less space in storage. Each reference element (RE) in a repeating substring is stored along with an operation code (OPC) and a flag. The first element in the repeating substring has an operation code that directs the storage of the first RE in a separate storage register. The OPC also indicates where the next element in the repeating pattern is stored. A repeat number is stored after the first element indicating how many times the repeating substrings is repeated after the first pass. The last element in the repeating substrings has a flag indicating it is the last element. The flag is used in determining whether to load the repeating number into a counter. If the last element matches an IE of an IP, then the repeating number is loaded into the counter while the next IE is compared to the stored first element without using an extra cycle. The remaining elements of the substring are compared to the IP and the counter decremented. If all of the elements in the repeated substring compare to elements in the IP, then the counter will be decremented to zero. When the counter reaches zero the next element after the repeated substring is compared to the IP. The amount of storage and processing required to compare RPs with repeated substrings to an IP is reduced and processing speed increased.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
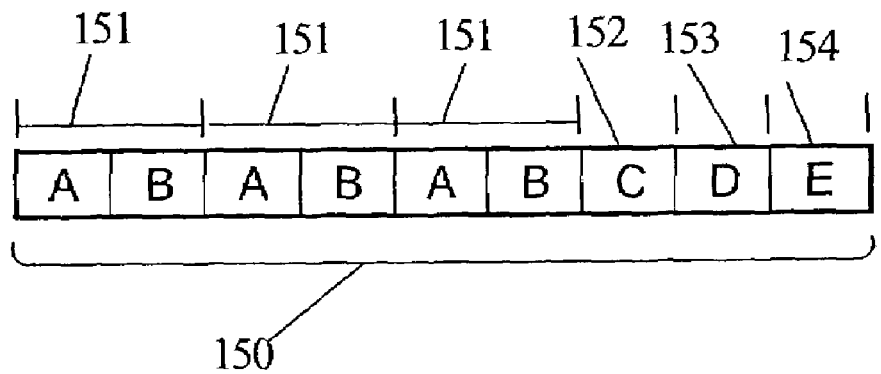
FIG. 1A illustrates a reference pattern (RP) with repeating substrings.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1A is a block diagram illustrating a RP 150 with nine reference elements (REs) (ABABABCDE). RP 150 is comprised of three repeating substrings (RSs) 151 and single REs 152–154.

Figure 1B:
FIG. 1B illustrates a compressed and encoded RP with repeating substrings according to embodiments of the present invention.
Figure 1B:
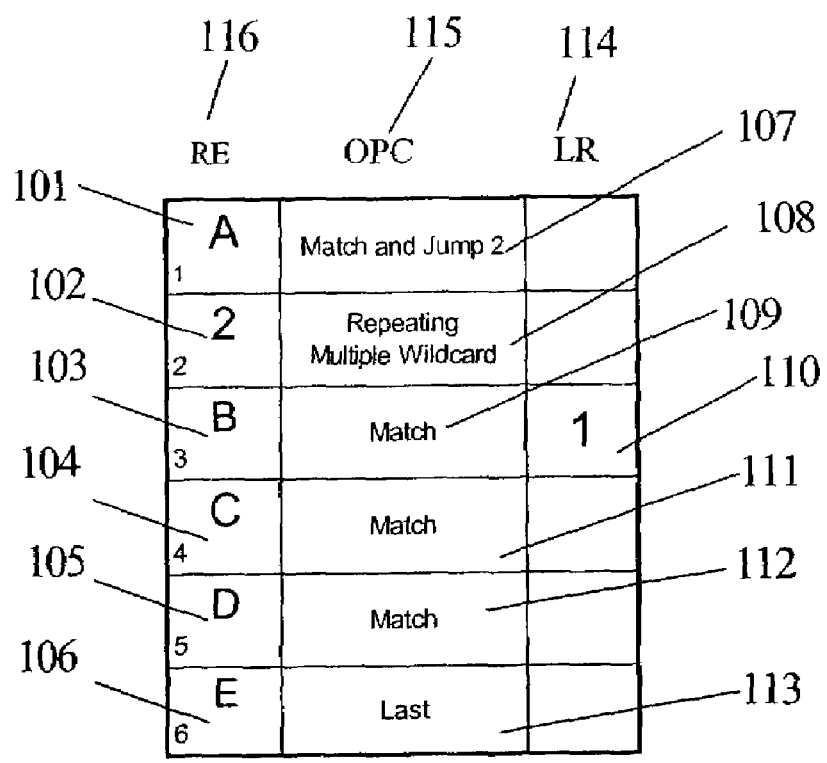

FIG. 1B is a block diagram of a RP 150 after it has been encoded as a compressed RP (CRP) 100 according to embodiments of the present invention. CRP 100 has RE 101, and REs 103–106. Element 102 is shown in the RE field, however it is not part of RP 150 itself, rather RE 102 is generated as part of the compression protocol used in embodiments of the present invention. RE 101 is the first element in CRP 100. RE 103 is the second and last element in RS 151. Since RE 103 is the last element in RS 151, it has the flag 110 set in the last repeating (LR) field 114. Each element in CRP 100 has an operation code (OPC) field 115 with stored OPC 107–109 and OPC 111–113. These OPCs define how the REs in RE field 116 are to be processed when they are read using embodiments of the present invention.

In pattern recognition, it may be desired to determine if RP 150 in FIG. 1A occurs in a stream of IEs defining an IP (not shown in FIG. 1A or FIG. 1B). RE 150 is compressed when it is stored as CRP 100 in an addressable storage unit (not shown). The first RE 101 is an "A" and is stored in address 1 (shown in small numbers in field 116 in FIG. 1B). OPC 107 is stored at the same address and defines how RE 101 is to be processed when it is read. In this case OPC 107, "Match and Jump 2," indicates that RE 101 is the first element in RS 150 and is compared to an element in an IP to determine if they "Match." OPC 107 indicates by "Jump 2" that the next element to be processed is to be read from address 3 (Jump 2 from address 1). Since RE 101 is the first element in RS 151, OPC 107 also indicates that RE 101 is to be saved in a separate register for possible future use. RE 103 is at address 3 and is a "B." OPC 109 (Match) indicates that RE 103 is simply compared to the next element in an IP when it is read. However, RE 103 also has flag LR 110 equal to a 1 indicating that it is the last repeating element in RS 151. The fact that RE 103 has LR 110 equal to a 1 modifies the processing of RE 103 when it is read. If RE 103 matches the element of the IP to which it is compared, then circuitry (not shown) that generates addresses for reading CRP 100 indicates that the RE at the address immediately following the saved first element (RE 101) is to be loaded into a counter as the "repeat number" indicating how many times after the first pass through the RS 150 that it is to be repeated. In this case "2" would be loaded into the repeat counter. If RE 101 and 103 successfully compare to sequential elements in a RP two additional times, then circuitry in the address generator generates an address for reading the next RE (RE 104) which is a "C." RE 104 has OPC 111 which is a simple "Match" indicating that it is to be compared to an IE and if it matches then the address for reading the next RE is incremented by accessing RE 105. If the entire RP 150 is contained in the IP, then RE 106 will eventually be read and compared to an element in the IP. RE 106 has OPC 113 which indicates that it is the last element in CRP 100 (and thus RP 150). At this time the process of comparing other elements in the IP may be continued to see if RP 150 again occurs in the IP or the process may be terminated.

In one embodiment of the present invention, RPs for pattern recognition are compressed by encoding according to following compression protocol:

(1) The first element in an RS in a CPR has an OPC (e.g., OPC 107) that directs storing the first element in a separate storage location (e.g. register). It also directs the address generator to increment the address used to read elements of the CPR by two once the first element compares to an IE in the IP.

(2) The repeat number for the RS is stored as the second element in the encoded RS in the CPR indicating how many times to repeat the RS after the first time it compares to elements in the IP.

(3) All other REs in the RS are sequentially compared to sequential IEs in the IP until the last element in the RS is reached. A repeat counter is decremented if the last element in the RS matches an IE in the IP. If this is the first pass through the RS, then the counter will already be at zero from initialization or a previous cycle through an RS. At this point the repeat count is loaded into a counter and an IE is compared to the stored first element.

(4) After the last element in the RS compares, the address generator restarts at the address of the first element. This process repeats until the counter is decremented to zero and the last element has matched an IE. At this time the next element in the RP after the RS is compared to a next element in the IP.

The preceding was a short explanation of embodiments of the present invention which will be explained in more detail in the following.

Figure 4:
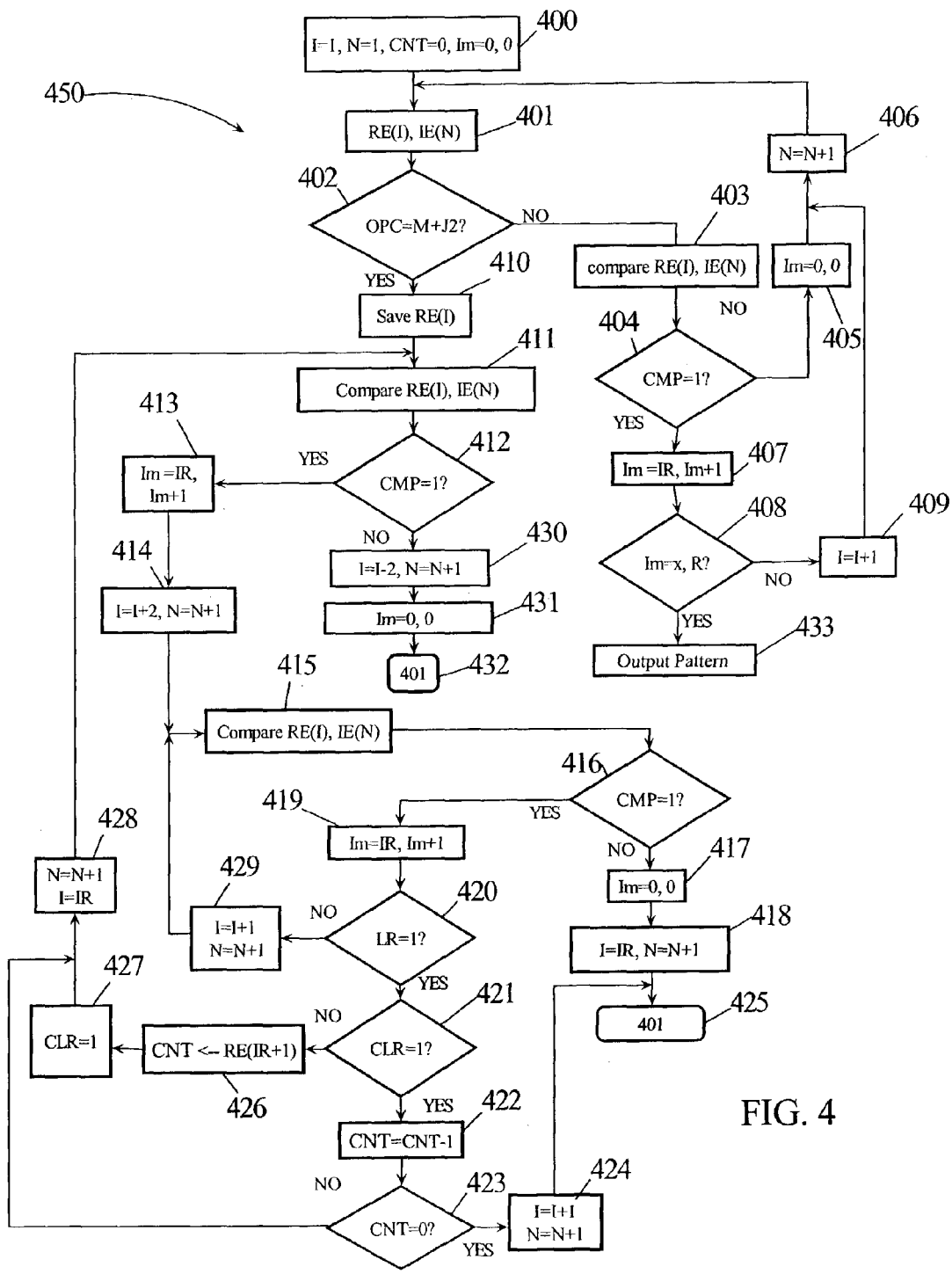
FIG. 4 is a flow diagram of method steps used in embodiments of the present invention.

FIG. 4 is a flow chart of method steps in embodiments of the present invention detailing embodiments of the present invention finding a RP with embedded RS in an IP. In step 400 indexes used in the remaining steps are initialized. In RE(I), the index "I" is used to identify which RE is being referred. To simplify the explanation, when a number is substituted for an index, the parenthesis are dropped. For example if 1=1, then RE(I) becomes RE1 and refers to the first RE in a reference pattern (RP).

In step 401, the RE(I) and IE(N) determined by their particular indexes "I" and "N" are read. These indexes represent the storage addresses for the RP and the IP. In the following, these indexes may initially start at one but in general any initial address values could be used Addresses may be incremented by one or any other desired number within circuitry used to generate the addresses.

In step 402, a test is done to determine if the OPC associated with RE(I) indicates that it is the first of an RS. The short hand description for the OPC indicating which is the first RE in an RS is; "Match and Jump 2" or simply "M+J2." If the result of the test in step 402 is NO, then the OPC is a simple "Match" and in step 403, RE(I) is compared to IE(N). In step 404, a test is done to determine if RE(I) did in fact match the IE(N). A match is indicated by the variable CMP. If CMP is equal to one, then the compared RE(I) and the IE(N) do match. If the result of the test in step 404 is NO, then in step 405 an index in "Im", used to keep track of the number of sequential compares, is set to zero indicating that RE(I) did not match IE(N). In step 406, index N is incremented by one and the next IE(N) is read. Since the RE(1) did not match the IE(N) in the first pass, index I is not incremented and the same RE(I) (index I not incremented) is used in step 401.

If RE(I) did compare to IE(N) in step 404, then in step 407, a match would be recorded. In this flow chart, a match is shown by recording (in index Im) the address (N) in the IP that first matches the first RE (RE1) and an index "MT" which keeps track of the number of sequential matches that occur following the first match (e.g., Im=N, MT). This means that the present index Im saves the index (N) of the IE that matched in step 404 along with a count (MT) indicating how many of the REs have sequentially matched sequential elements in the IP. Other methods of recording the occurrence of a match between all the REs in a RP and an equal number of sequential IEs in an IP may be used and still be within the scope of the present invention.

After step 407 records that an RE(I) matches an IE(N), then in step 408, a test is done to determine if all R elements of the RP have matched an equal number of sequential IEs in the IP. If the result of the test in step 408 is NO, then in step 409 the index I is incremented by one and in step 406 index N is incremented by one. If the result of the test in step 408 is YES, then the complete RP has been found in the IP and the data defining the match is outputted in step 433.

If the OPC in step 402 is equal to "M+J2", then a repeating substring (RS) is being processed in the CPR (e.g., CPR 100 in FIG. 1B). If the result of the test in step 402 is YES, then in step 410 the first element of the RS (RE with the present index I) is saved in a separate storage register. In step 411, RE(I) and IE(N) are compared. In step 411, a test is done to determine if they matched (CMP=1 indicates a match). If the result of the test in step 412 is YES, then in step 413 the match is recorded as described in step 407 above. Since the OPC was "M+J2" (in step 402), which indicates that the RE is the first element in an RS, it means that the REs that follow the first RE are encoded and compressed according to the protocol described relative to FIG. 1B. Instead of incrementing index I by one, an OPC of "M+J2" directs that index I is incremented by two so that the repeat number (e.g., RE 102 in FIG. 1B) is skipped and instead the next RE in the RS is read. Therefore, in step 414, index I is incremented by two and index N is incremented by one. The next sequential RE in the RS and the next IE in the IP are then read. In step 415, RE(I) and IE(N) are compared. In step 416 a test is done to determine if they match (CMP=1 indicates a match). If the result of the test in step 416 is NO, then only the first RE in the RS matched an element in the IP. Therefore, in step 417, the index IM that tracks matches is again set back to zero. In step 418, index I is set to "IR" which is the index value of I when the first RE in the RS was read. Index N is incremented by one to access the next IE in the IP to continue the compare process. In step 425, a branch is taken back to step 401.

If the result of the test in step 416 is YES, then the second RE in the RS matches the next IE(N). In step 419, the match is recorded by updating Im as described in step 407. In step 420, a test is done to determine the flag (LR), indicating that RE being processed is the last RE in the RS, is equal to one. If the result of the test in step 420 is YES, then an index CLR is tested in step 421. Index CLR is equal to one if the RS has already been successfully matched once. During the first pass through the RS, CLR is equal to zero and the result of the test in step 421 is NO. In step 426, a counter (CNT) is set equal to the value of RE(IR) in the CPR (e.g., it would be 2 in CPR 100). In step 427, index CLR is set equal to one since the first pass through the RS has been completed. In step 428, index I is set to the value IR (first RE in the RS) and index N is incremented by one to access the next IE in the IP. A branch is then taken back to step 411 where RE(I) and IE(N) are again compared.

After the first successful compare pass through the RS (all REs in the RS match IEs), CLR will be equal to one since it was set to one in step 427. Therefore, in step 421 (the second successful compare pass), the result of the test is YES (CLR is equal to one) and in step 422 the CNT is decremented (keeps track of the number of time the RS is repeated). A test is then done in step 423 to determine if CNT has been decremented to zero. If it has not been decremented to zero, then more successful compare passes through the RS are required to determine if the entire RP with the RS matches to the IP.

Since CNT is not equal to zero, a branch is taken to step 428 where index I is reset to IR and N is incremented by on then a branch is taken back to step 411 where the steps continue as previously described. If the result of the test in step 423 is YES, then the RS has be successfully compared to sequential IEs in the IP for the number of times indicated by the value of RE(IR) plus one (the initial pass). In step 424, index I is incremented by one. Since at this point the last value of I corresponds to the last RE in the RS (tested in step 420), then indexing I by one would move to the next RE after the RS of the RP. In step 424, N is also incremented by one to to access the next IE to determine if the remaining elements of the RP, outside of the RS, match IEs of the IP. Then in step 425 a branch is taken back to step 401 to process additional IEs.

Figure 3A:
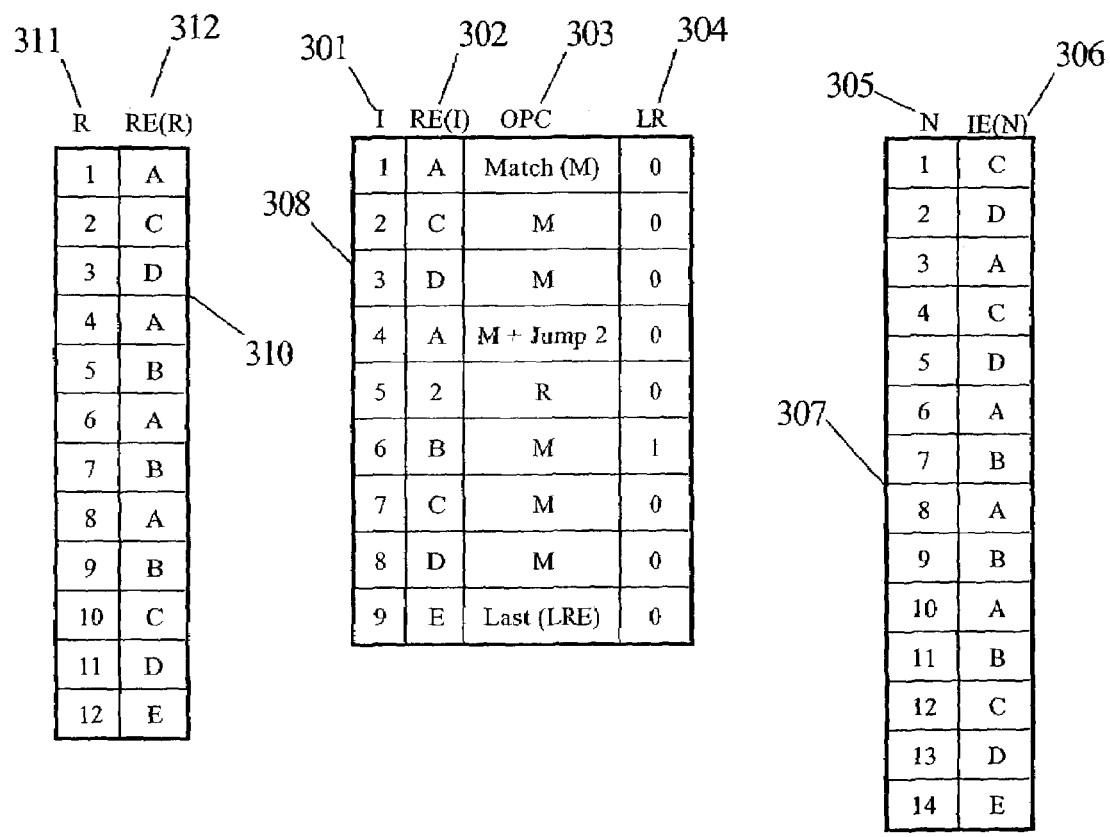
FIG. 3A illustrates a RP, an input pattern (IP), and a compressed and encoded form of the RP.

FIG. 3A illustrates an RP 310 containing a number of R reference elements. Values in index R 311 represents the addresses of the REs in RE(R) 312. CRP 308 illustrates how RP 310 is compressed and encoded according to embodiments of the present invention. Values in index 1301 represents the storage addresses of the REs in RE(I) 302. Each RE(I) 302 has a corresponding OPC 303 and a flag LR 304. IP 307 has index N 305 which represents the address or sequence number corresponding to each of the elements IE(N) 306.

Figure 3B:
FIG. 3B is a table of steps and actions taken when reading and comparing elements from the compressed and encoded RP to elements in the IP according to embodiments of the present invention.

In FIG. 3B, the table 350 illustrates the steps that are taken through flow diagram 450 in FIG. 4, when comparing CRP 308 to IP 307. Arrow 357 indicates that step sequences 351–353 are read from the top to the bottom of table 350. Actions 354–356 are shown next to the step numbers from flow diagram 450.

Starting with step sequence 351. In step 400, the indexes I, N, Im, and CLR are set. In step 401 RE1 and IE1 are loaded into a comparator (not shown). In step 402, the OPC (of RE1) is decoded as "Match" (M) and indicates that RE1 and IE1 are to be compared. In step 403, RE1 which is an "A" and IE1 which is a "C" are compared. In step 404, it is determined that they do not match (indicated by CMP not equal to one). In step 405, the index Im is reset indicating a match was not recorded. In step 406, only index N is incremented by one to a value of two. In step 401, RE1 and IE2 are loaded into the comparator. Again the OPC for RE1 is decoded as M and in step 403, RE1=A is compared to IE2=D. Step 404 determines that they do not compare (CMP is not equal to one). Again, in step 405, Im is reset. In step 406, index N is incremented by one so N=3. In step 401, RE 1 and IE3 are loaded into the comparator. Again the OPC for RE1 is decoded as M, and in step 403 RE1=A is compared to IE3=A. Step 404 determines that they do compare (CMP is equal to one). In step 407, index value Im is loaded with the index (address) value 3, which identifies which element of IP 307 matches the first element of RP 310 and corresponding CRP 308.

Since a match has been determined, in step 408 the index I is tested to determine if all R elements of RP 310 have matched a sequence in IP 307. Since it is the first compare, index I is not equal to index R. Therefore, in step 409, index I is incremented by one (I=2) and in step 406 index N is incremented by one (N=4). A branch back to step 401 loads RE2 and IE4 into the comparator. Step 402 decodes the OPC of RE2 as M indicating a simple compare operation. In step 403, RE2=C is compared to IE4=C and again they compare as indicated by CMP equal to one. In step 407, index Im is updated recording a second sequential match, IE4 matches RE2. Since a match was recorded, index I is again tested to determine if all of the REs in CRP 100 have been processed. In step 407, index Im is not equal to R and in step 409 index I is incremented (1=3) and in step 406 index N is incremented by one (N=5). In step 401, RE3 and IE5 are loaded into the comparator. The OPC of RE3 is decoded as M indicating a simple compare. In step 403, RE3=D is compared to IE5=D and again they match. In step 404, CMP is equal to one indicating a successful compare.

Continuing with step sequence 352: In step 407, index Im is updated indicating a third sequential match of RE3 and IE5. Since a match was recorded, index Im is tested to see if all of the R REs have been processed. In step 408, the current value of the index in Im (simply Im) is not equal to R, therefore, in step 409 index I is incremented by one (I=4) and index N is incremented by one (N=6) in step 406. In step 401, RE4 and IE6 are loaded into the comparator. The OPC of RE4 is decoded in step 402 as M+J2 which indicates the RE4 is the first element of a repeating substring (RS). In step 410, RE(IR) is saved where IR is the value of index I corresponding to the first RE in the RS. In this case, IR is equal to four. In step 411, RE4=A is compared to IE6=A. They match as indicated by CMP is equal to one in step 412. In step 413, index Im is updated to indicate that four sequential matches have occured. Because the OPC of RE4 was decoded as M+J2, index I is incremented by two (I=6) to "Jump" over the repeat count stored in RE5. Index N is incremented by one (N=7). In step 415, RE6=B is compared to IE7=B. They compare indicated by CMP equal to one in step 416. In step 419, index Im is updated to indicating five consecutive matches between elements in CRP 308 and IP 307. Since RE6 matched IE7, flag LR is tested in step 420 to determine if RE6 is the last element in the RS. In this case LR is equal to one indicating it is the last repeating element.

Since LR=1, in step 421 index CLR is tested to determine if this is the second pass through the RS. CLR is equal to zero, so in step 426 a counter CNT is set to the count value stored in RE(IR). IR equals to four, the index of the first element in the RS. Therefore the repeat count value is loaded from RE5 (repeat count=2). A repeat count value of two indicates that the RS is repeated three times (two times after the first time). In step 427, CLR is set to one so that step 426 will not be repeated the next time through the RS. In step 428, index I is set to IR (4) and N is incremented by one (N=8). In step 411, RE4=A is compared to IE8=A. They match as indicated by CMP equal to one in step 412. In step 413, Im is updated to indicate six consecutive matches of an element of CRP 308 to an element of IP 307. Since the OPC of RE4 was decoded as a M+J2, index I is incremented by two (I=6) and index N is incremented by one (N=9). In step 415, RE6=B is compared to IE9=B. They compare as indicated by CMP equal to one in step 416. In step 419, Im is updated indicating seven consecutive matches of an element of CRP 308 to an element of IP 307. In step 420, LR is equal to one. This time through the RS, L R is equal to one (set to one in step 427), therefore, in step 422, CNT is decremented by one (CNT=1). In step 423, CNT is tested to see if its count value is equal to zero. If CNT is equal to zero, then the RS has been processed the number of times determined by the repeat count loaded from RE(IR) plus one. In step 423, CNT is not equal to zero (CNT=1) and a branch is taken to step 428 where index I is set to IR (I=4) and index N is incremented by one (N=10).

The sequence of steps starting with step 411 are again executed. In step 411, RE4=A is compared to IE10=A and they compare as indicated by CMP equal to one in step 412. In step 413, Im is updated indicating eight consecutive matches of an element of CRP 308 to an element of IP 307. In step 414, index I is again incremented by two (I=6) to jump over the repeat number stored in RE5 and index N is increment by one (N=11). In step 415, RE6=B is compared to IE11=B. They compare as indicated by CMP equal to one in step 416. In step 419, a match is recorded by updating the index in Im to nine. Again, in step 420, LR is equal to one, therefore, step 421 is executed where CLR is equal to one. In step 422, CNT is again decremented, this time to zero. In step 423, CNT is then equal to zero indicating that the RS has been repeated the desired number of time determined by repeat number in RE(IR) plus one (three times). In step 424, index I is incremented by one (I=7) and N is incremented by one (N=12). In step 425, a branch is taken back to step 401. In step 401, RE7 and IE12 are loaded into the comparator. The OPC of RE7 is again decoded as an M. In step 403, RE7=C is compared to IE12=C. They match as indicated by CMP equal to one in step 404. In step 407, a match is recorded by updating the index in Im to ten. In step 408, the index of Im is compared to R to see if all of the R elements of RP 310 have been processed. Im=10 is not equal to R=12 and in step 409 index I is incremented by one (I=8) and in step 406 index N is incremented by one (N=13). A branch is taken back to step 401 where RE8 and IE13 are loaded into the comparator. The OPC of RE8 is decoded as an M indicating a simple match. In step 403, RE8=D is compared to IE13=D and they compare as indicated by CMP equal to one in step 404. In step 407, index in Im is updated by one to eleven. Im=11 is not equal to R=12 in step 408, therefore, in step 409 index I is incremented by one (I=9) and index N is incremented by one (N=14) in step 406. In step 401, RE9 and IE14 are loaded into the comparator. Again RE9 has an OPC decode of M. In step 403, RE9=E is compared to IE14=E and they compare as indicated by CMP equal to one in step 404. In step 407, Im is updated by one to twelve. In step 408, Im=12 is equal to R=12 indicating the RE9 is the last element in RP 310 and thus corresponding CRP 308. Therefore, in step 433, the data determining the location of the occurrence of RP 310 in IP 307 is outputted.

The preceding has shown how a simple RP 310 with an RS is compressed and encoded to CRP 308 and how CRP 308 is read and decoded to allow comparison of elements of the RP 310 to the elements of an IP 307. More complicated RPs would be handled in a similar manner using embodiments of the present invention.

Figure 2:
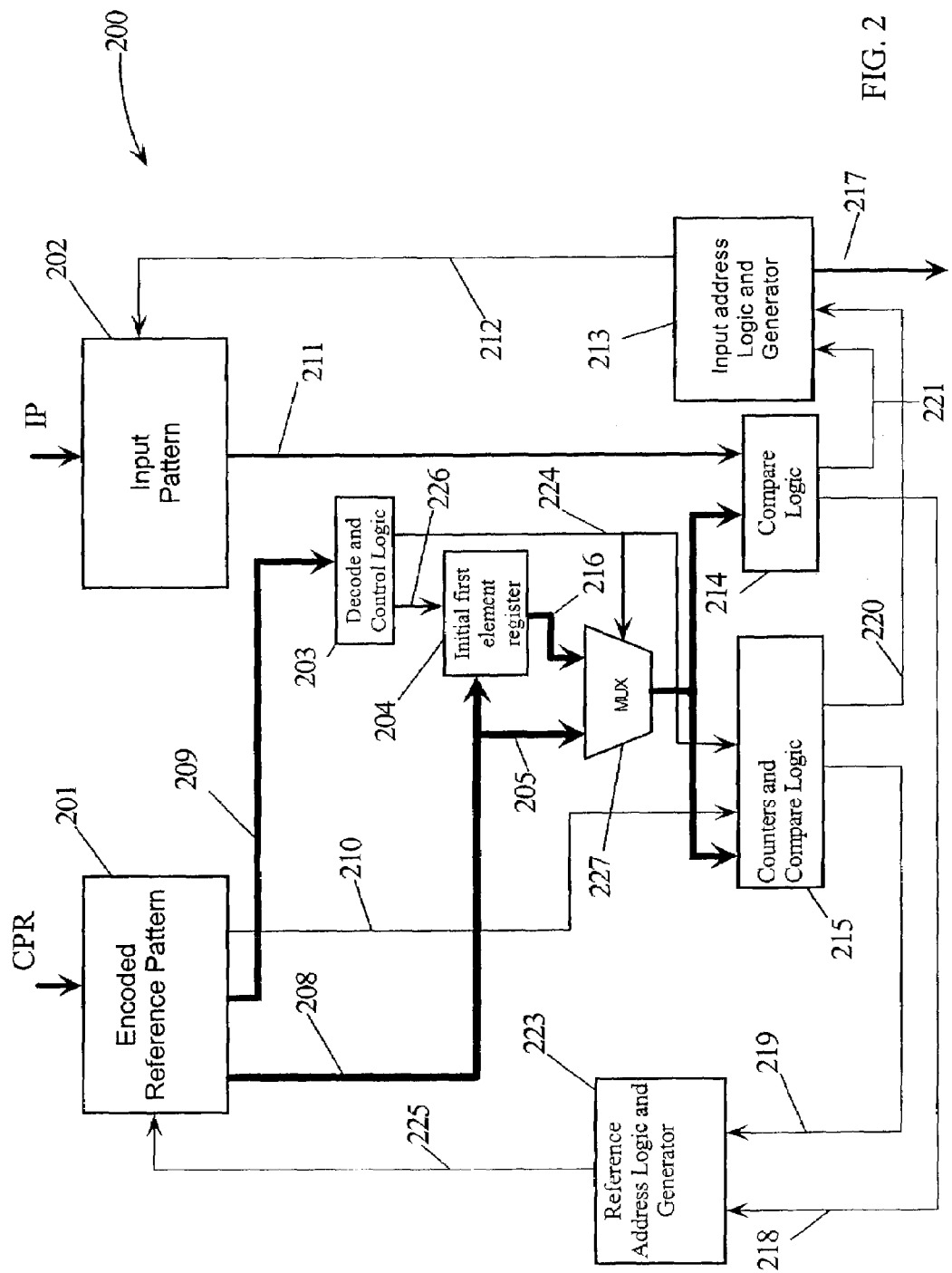
FIG. 2 is a block diagram of system components used to read compressed and encoded RPs with repeating substrings according to embodiments of the present invention.

FIG. 2 is a block diagram of a system 200 for decoding and comparing a CRP (e.g., CRP 308) to an IP (e.g., IP 307). Addressable storage 201 is used to store a CRP compressed and encoded using a protocol according to embodiments of the present invention. Each entry of the CRP comprises an RE 208, corresponding OPC 209, and last element flag LR 210. Unit 223 comprises address logic and an address generator for generating addresses for addressable storage 201. Each time a new address is presented on address lines 225, storage 201 presents an RE 208 and a corresponding OPC 209 and flag LR 210. OPC 209 is decoded in decoder/controller 203 which generates a signal 226 to gate register 204 which provides separate storage for the first RE in an RS. Decoder 203 also sends a signal 224 to multiplexer (MUX) 227 and counter and compare logic 215. If a decode of a OPC 209 indicates that a repeat number (e.g., RE 102) is to be loaded into a repeat counter (not shown) in Counter and Compare logic 215, then the saved RE in register 204 is loaded into Compare logic 214 where it is compared to an IE in IP 202 while the repeat number is read from CRP 201 and loaded into the repeat counter. Decode signals 224 and LR 210 are also used to direct incrementing, decrementing, and loading the repeat counter (not shown) in Counter and Compare logic 215. The results of the compare in Compare logic 214 are used to index the Input Address logic and Generator 213 which sends address 212 to IP storage buffer unit 202. Input Address logic and Generator 213 also receives a signal 220 from Counters and Compare logic 215 to synchronize outputting a next address 212 to access an IE. Reference Address logic and Generator 223 receives a signal 218 from Compare logic 214 indicating the compare results and status. Reference Address logic and Generator 223 also receives a signal 219 indicating the status of the repeat counter and the amount to increment or decrement the Reference Address counter.

System 200 in FIG. 2 may be realized by a software routine programmed into a computer with sufficient speed to process the IP in real time or the IP may be stored in a memory subsystem and then read out and processed at system speed. RPs may be compressed and encoded using a set of instructions and the resulting compressed and encoded CRPs may be stored in RAM for later processing. Counters, registers, multiplexers, and comparators may be implemented as software routines and still be within the scope of the present invention.

Figure 5:
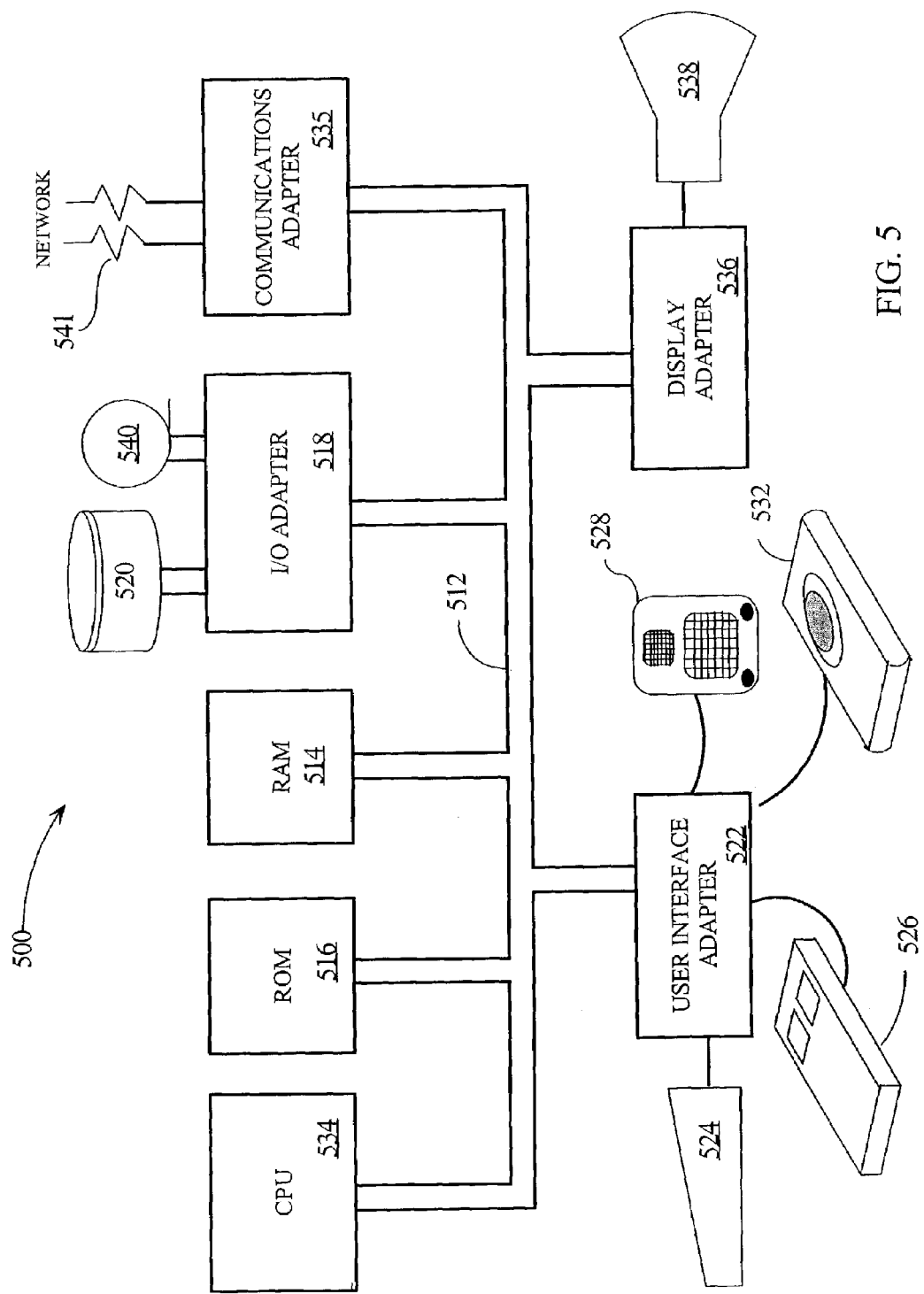
FIG. 5 is a block diagram of a data processing system that may run software routines that implement method steps in embodiments of the present invention for comparing RPs with repeating substrings to IPs.

A representative hardware environment 500 for practicing the present invention is depicted in FIG. 5, having CPU 534, for executing instructions implementing method steps according to the present inventive principles, and a number of other units interconnected via system bus 512. System 500 includes random access memory (RAM) 514, read only memory (ROM) 516, and input/output (I/O) adapter 518 for connecting peripheral devices such as disk units 520 to bus 512, user interface adapter 522 for connecting keyboard 524, mouse 526, and/or other user interface devices such as a touch screen device (not shown) to bus 512, communication adapter 534 for connecting the system to a data processing network, and display adapter 536 for connecting bus 512 to display device 538.

RPs may be stored on disk units 520. RPs may then be read into CPU 534 which contains instructions for compressing and encoding the RPs into CRPs according to embodiments of the present invention. The CPRs may be stored in RAM 514. IPs may have been stored on a disk units 520 or they may be received from an I/O unit 540 or from a remote device over communication network 541. A user may input search requests from a device via user interface 522 to search the IP to determine if various RPs occur in the IP. Results of the compare may be outputted to display 538 or stored in disk units 520. To facilitate fast processing, the IP and the RPs may be stored in RAM 514 and accessed by CPU 534. Software routines may be executed by CPU 534 to read the CRPs from RAM 514 by generating addresses according to embodiments of the present invention. Instructions may decode the CRPs and compare the REs in the CRP to IEs in the IP to determine if they match. Results of the comparisons may be stored for later use in RAM 514 or disk units 520.

Although the present invention and its advantages have been described in detail, it should be understood that various changes, substitutions and alterations can be made herein without departing from the spirit and scope of the invention as defined by the appended claims.

What is claimed is:

1. A method for comparing a K element reference pattern with repeating substrings to an N element input pattern comprising the steps of:
   compressing said reference pattern, forming a compressed reference pattern, by encoding repeating substrings within said reference pattern into encoded substrings according to a first protocol;
   storing said compressed reference pattern in an addressable storage unit;
   reading reference elements of said compressed reference pattern from said storage unit, wherein an order of reading said reference elements is modified in response to decoding said encoded substrings according to said first protocol;
   processing reference elements read from said compressed reference pattern; and
   modifying addresses for reading said reference elements of said compressed reference pattern in response to said processing step.

2. The method of claim 1, further comprising the step of reading an input element of said input pattern.

3. The method of claim 2, wherein said step of processing reference elements read from said compressed reference pattern comprises comparing a reference element of said reference pattern to said input element of said input pattern.

4. The method of claim 1, wherein said first protocol comprises the steps of:
   storing a first reference element in a repeating substring of said compressed reference pattern with a first operation code;
   storing a repeat number, corresponding to a number of times said repeating substring is sequentially repeated after its first appearance in said reference pattern, with a second operation code;
   storing subsequent reference elements of said repeating substring with a third operation code, said subsequent reference elements stored following said repeat number; and storing a flag with a third reference element of said repeating substring.

5. The method of claim 4, wherein said first protocol further comprises the steps of:
reading said first reference element of said repeating substring;
processing said first reference element in response to said first operation code;
generating an address for reading a second reference element of said repeating substring in response to said first operation code and a result of said step of processing said first reference element;
processing said second reference element in response to said third operation code;
processing reference elements subsequent to said second reference element in response to a result of said step of processing said second reference element; and
generating an address for reading said repeat number of said substring in response to a result from processing said reference elements subsequent to said second reference element and to a result from processing said third reference element having said flag.

6. The method of claim 4, wherein said first protocol further comprises the steps of:
loading said repeat number into a repeat counter in response to said result of processing said third reference element with said flag;
comparing an input element of said input pattern to said saved first reference element in response to said result of processing said third reference element with said flag;
decrementing said counter by one in response to each of said results of processing said third reference element with said flag; and
generating an address for reading a reference element of said compressed reference pattern not in said repeating substring in response to said counter having a count of zero.

7. The method of claim 1, further comprising the step of stopping a compare of input elements of said input pattern to reference elements read from said compressed reference pattern when a sequence of reference elements in said reference pattern matches a sequence of input elements in said input pattern.

8. A system for comparing a K element reference pattern with repeating substrings to an N element input pattern comprising:
an addressable storage unit for storing data defining said reference pattern;
circuitry for compressing said reference pattern, forming a compressed reference pattern, by encoding repeating substrings within said reference pattern into encoded substrings according to a first protocol;
circuitry for storing said compressed reference pattern sequentially in said addressable storage unit;
circuitry for reading reference elements of said compressed reference pattern from said addressable storage unit, wherein an order of reading said reference elements is modified in response to operational signals generated from decoding said encoded substrings according to said first protocol;
circuitry for processing reference elements read from said compressed reference pattern; and
circuitry for modifying addresses for reading said reference elements of said compressed reference pattern in response to first signals generated as a result of said circuit processing reference elements read from said compressed reference pattern.

9. The system of claim 8, further comprising circuitry for reading an input element of said input pattern.

10. The system of claim 9, wherein said first signals result from comparing a reference element of said reference pattern to said input element of said input pattern.

11. The system of claim 8, wherein said first protocol comprises:
circuitry for storing a first reference element of a repeating substring of said encoded reference pattern and storing a first operation code for processing said first reference element;
circuitry for storing a repeat number, corresponding to a number of times said repeating substring is sequentially repeated after its first appearance in said reference pattern and storing a corresponding second operation code for processing said second reference element;
circuitry for storing subsequent reference elements of said repeating substring and storing a third operation code for each of said subsequent reference elements stored following said repeat number; and
circuitry for storing a flag indicating a third reference element of said repeating substring is a last reference element.

12. The system of claim 11, wherein said first protocol further comprises:
circuitry for reading said first reference element of said repeating sub string;
circuitry for processing said first reference element in response to a signal state generated by reading said first operation code;
circuitry for generating an address for reading a second reference element of said repeating substring in response to said signal state generated by reading said first operation code and a signal state generated from processing said first reference element;
circuitry for processing said second reference element in response to signal states generated by reading said third operation code;
circuitry for processing reference elements subsequent to said second reference element in response to signal states generated by processing said second reference element; and
circuitry for generating an address for reading said repeat number of said substring in response to signal states generated by processing said reference elements subsequent to said second reference element and in response to signal states generated from processing said third reference element having said flag.

13. The system of claim 12, wherein said first protocol further comprises:
circuitry for loading said repeat number into a counter in response to said result of processing said third reference element with said flag;
circuitry for comparing an input element of said input pattern to said saved first reference element in response to said signal states generated from processing said third reference element having said flag;
circuitry for decrementing said counter by one in response to each processing of said third reference element with said flag; and
circuitry for generating an address for reading a reference element of said compressed reference pattern not in said repeating substring in response to a signal generated when said counter has a count of zero.

14. The system of claim 8 further comprising circuitry for stopping a compare of input elements of said input pattern to reference elements read from said compressed reference pattern when a sequence of reference elements in said reference pattern matches a sequence of input elements in said input pattern.

15. A data processing system comprising:
a central processing system (CPU);
a random access memory (RAM);
an input/output device (I/O) interface coupled to an I/O unit;
a user interface for inputting user requests to said CPU;
a bus system coupling said CPU, RAM, and said I/O interface, and circuitry for compressing a reference pattern, forming a compressed reference pattern, by encoding repeating substrings within said reference pattern into encoded substrings according to a first protocol;
circuitry for storing said compressed reference pattern sequentially in said addressable storage unit;
circuitry for reading reference elements of said compressed reference pattern from said addressable storage unit, wherein an order of reading said reference elements is modified in response to operational signals generated from decoding said encoded substrings according to said first protocol;
circuitry for processing reference elements read from said compressed reference pattern; and
circuitry for modifying addresses for reading said reference elements of said compressed reference pattern in response to first signals generated as a result of said circuit processing reference elements read from said compressed reference pattern.

16. The data processing system of claim 15, further comprising circuitry for reading an input element of said input pattern.

17. The data processing system of claim 16, wherein said first signals result from comparing a reference element of said reference pattern to said input element of said input pattern.

18. The data processing system of claim 15, wherein said first protocol comprises:
circuitry for storing a first reference element of a repeating substring of said encoded reference pattern and storing a first operation code for processing said first reference element;
circuitry for storing a repeat number, corresponding to a number of times said repeating substring is sequentially repeated after its first appearance in said reference pattern and storing a corresponding a second operation code for processing said second reference element;
circuitry for storing subsequent reference elements of said repeating substring and storing a third operation code for each of said subsequent reference elements stored following said repeat number; and circuitry for storing a flag indicating a third reference element of said repeating substring is a last reference element.

19. The data processing system of claim 18, wherein said first protocol further comprises:
circuitry for reading said first reference element of said repeating substring;
circuitry for processing said first reference element in response to a signal state generated by reading said first operation code;
circuitry for generating an address for reading a second reference element of said repeating substring in response to said signal state generated by reading said first operation code and a signal state generated from processing said first reference element;
circuitry for processing said second reference element in response to signal states generated by reading said third operation code;
circuitry for processing reference elements subsequent to said second reference element in response to signal states generated by processing said second reference element; and
circuitry for generating an address for reading said repeat number of said substring in response to signal states generated by processing said reference elements subsequent to said second reference element and in response to signal states generated from processing said third reference element having said flag.

20. The data processing system of claim 19, wherein said first protocol further comprises:
circuitry for loading said repeat number into a counter in response to said result of processing said third reference element with said flag;
circuitry for comparing an input element of said input pattern to said saved first reference element in response to said signal states generated from processing said third reference element having said flag;
circuitry for decrementing said counter by one in response to each processing of said third reference element with said flag; and
circuitry for generating an address for reading a reference element of said compressed reference pattern not in said repeating substring in response to a signal generated when said counter has a count of zero.

21. The data processing system of claim 15 further comprising circuitry for stopping a compare if input elements of said input pattern to reference elements read from said compressed reference pattern when a sequence of reference elements if said reference pattern matches a sequence of input elements in said input pattern.

* * * * *